(12) United States Patent
Chiu

(10) Patent No.: US 11,257,694 B2
(45) Date of Patent: Feb. 22, 2022

(54) SEMICONDUCTOR DEVICE HAVING HYBRID BONDING INTERFACE, METHOD OF MANUFACTURING THE SEMICONDUCTOR DEVICE, AND METHOD OF MANUFACTURING SEMICONDUCTOR DEVICE ASSEMBLY

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 51 days.

(21) Appl. No.: 16/781,377

(22) Filed: Feb. 4, 2020

(65) Prior Publication Data
US 2021/0242050 A1    Aug. 5, 2021

(51) Int. Cl.
  *H01L 21/67*  (2006.01)
  *H01L 23/528*  (2006.01)
  *H01L 23/00*  (2006.01)

(52) U.S. Cl.
  CPC .. *H01L 21/67121* (2013.01); *H01L 21/67063* (2013.01); *H01L 23/528* (2013.01); *H01L 24/03* (2013.01); *H01L 24/05* (2013.01); *H01L 24/27* (2013.01); *H01L 24/80* (2013.01); *H01L 2224/02163* (2013.01); *H01L 2224/0361* (2013.01); *H01L 2224/08145* (2013.01); *H01L 2224/80004* (2013.01)

(58) Field of Classification Search
CPC ......... H01L 23/258; H01L 2224/08145; H01L 2224/002143; H01L 21/67121
See application file for complete search history.

(56) References Cited

U.S. PATENT DOCUMENTS

| 10,944,041 | B1 * | 3/2021 | Tsai | ................ B06B 1/0292 |
| 2015/0364434 | A1 * | 12/2015 | Chen | ................ H01L 23/53228 257/773 |
| 2016/0197055 | A1 * | 7/2016 | Yu | ................ H01L 24/81 257/737 |

* cited by examiner

*Primary Examiner* — Dale E Page
*Assistant Examiner* — Wilner Jean Baptiste
(74) *Attorney, Agent, or Firm* — Muncy, Geissler, Olds & Lowe, P.C.

(57) ABSTRACT

The present disclosure provides a semiconductor device, a method of manufacturing the semiconductor device and a mothed of method of manufacturing a semiconductor device assembly. The semiconductor device includes a substrate, a bonding dielectric disposed on the substrate, a first conductive feature disposed in the bonding dielectric, an air gap disposed in the bonding dielectric to separate a portion of a periphery of the first conductive feature from the bonding dielectric, and a second conductive feature including a base disposed in the bonding dielectric and a protrusion stacked on the base.

6 Claims, 15 Drawing Sheets

SEMICONDUCTOR DEVICE HAVING HYBRID BONDING INTERFACE, METHOD OF MANUFACTURING THE SEMICONDUCTOR DEVICE, AND METHOD OF MANUFACTURING SEMICONDUCTOR DEVICE ASSEMBLY

TECHNICAL FIELD

The present disclosure relates to a semiconductor device, a method of manufacturing the semiconductor device, and a method of manufacturing a semiconductor device assembly, and more particularly, to a semiconductor device having a hybrid bonding interface, a method of manufacturing the semiconductor device, and a method of bonding the semiconductor devices.

DISCUSSION OF THE BACKGROUND

Semiconductor devices are used in a variety of electronic applications, such as personal computers, cell phones, digital cameras, and other electronic equipment. The fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve the integration density of the microelectronic components by continual reduction of minimum feature size, which allows more components to be integrated into a given area. Smaller package structures with smaller footprints are developed to package the semiconductor devices. For example, in an attempt to further increase density of the semiconductor device, three-dimensional (3D) integrated circuits including stacking of two or more microelectronic components have been investigated.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a bonding dielectric disposed on the substrate, at least one first conductive feature and at least one air gap disposed in the bonding dielectric, wherein the air gap separates a portion of a periphery of the first conductive feature from the bonding dielectric. A second conductive feature includes a base disposed in the bonding dielectric and a protrusion stacked on the base.

In some embodiments, the air gap has a first width, and the protrusion of the second conductive feature has a second width less than the first width.

In some embodiments, the base of the second conductive feature has a third width, and the first conductive feature has a fourth width less than the third width.

In some embodiments, the third width is equal to a sum of the first width and the fourth width.

In some embodiments, the semiconductor device further includes a plurality of diffusion barrier liners disposed between the bonding dielectric and the first conductive feature and between the bonding dielectric and the base.

In some embodiments, the second conductive feature has an L-shaped contour.

Another aspect of the present disclosure provides a method of manufacturing a semiconductor device. The method includes steps of forming a dielectric layer on a substrate; etching the dielectric layer to create a plurality of openings in the dielectric layer; applying a sacrificial layer in at least one of the openings to cover at least a portion of the dielectric layer; forming at least one first conductive feature in the openings where the sacrificial layer is disposed and a plurality of bases in the openings where the sacrificial layer is not disposed; removing the sacrificial layer to form at least one air gap in the dielectric layer; and forming a plurality of protrusions on the bases.

In some embodiments, in a pair of openings, only a portion of the dielectric layer is covered by the sacrificial layer.

In some embodiments, the first conductive feature and the bases are arranged in an interleaved configuration.

In some embodiments, the first conductive feature and the bases are formed using a plating process.

In some embodiments, the first conductive feature, the bases and the protrusions comprise a same material.

In some embodiments, the formation of the protrusions includes steps of applying a patterned mask comprising a plurality of through holes on the dielectric layer, the first conductive feature and the bases, wherein portions of the bases are exposed through the through holes; and performing a plating process to deposit a conductive material in the through holes.

In some embodiments, the method further includes steps of depositing a diffusion barrier layer in the openings before the applying of the sacrificial layer in the openings; and removing portions of the diffusion barrier layer not cover by the first conductive feature and the base after the formation of the protrusions.

Another aspect of the present disclosure provides a method of manufacturing a semiconductor device assembly. The method includes steps of providing a pair of semiconductor devices comprising at least one first conductive feature and at least one second conductive feature having complimentary structures; aligning the semiconductor devices to cause the first conductive feature of one of the semiconductor devices to be in contact with the second conductive feature of the other semiconductor device; and performing an annealing process to bond the first conductive feature to the second conductive feature.

In some embodiments, the semiconductor devices further include a bonding dielectric covering portions of a periphery of the first conductive feature and enclosing the second conductive feature, wherein the bonding dielectrics are fused during the performing of the annealing process.

In some embodiments, a void is introduced between the first and second conductive features after the alignment of the semiconductor devices.

In some embodiments, the void is eliminated after the performing of the annealing process due to the thermal expansion of the first and second conductive features.

In some embodiments, the connected first and second conductive features serve as an electrical interconnection to the semiconductor devices.

In some embodiments, the semiconductor device includes a plurality of first conductive features and a plurality of second conductive features arranged in an interleaved configuration.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
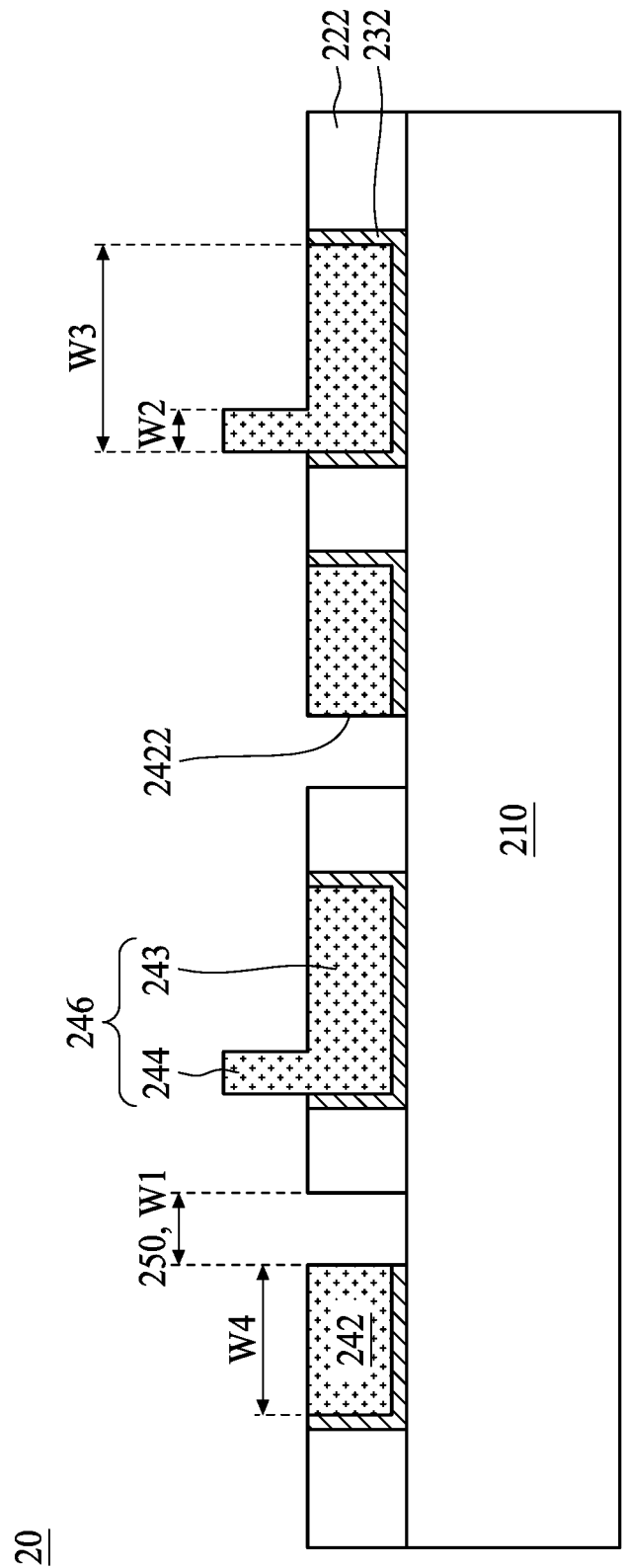
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 20 in accordance with some embodiments of the present disclosure. The semiconductor device 20 includes a substrate 210, a bonding dielectric 222 disposed on the substrate 210, and one or more first conductive features 242 and one or more second conductive features 246 disposed in the bonding dielectric 222, wherein a portion of a periphery 2422 of the first conductive feature 242 is exposed through the bonding dielectric 222. In other words, an air gap 250 is disposed in the bonding dielectric 222 to separate the portion of the first conductive feature 242 from the bonding dielectric 222. In some embodiments, the first and second conductive features 242 and 246 can penetrate through the bonding dielectric 222 to contact the substrate 210.

The first conductive features 242 and the second conductive features 246, made of metal or metal alloys, are arranged in an interleaved configuration. The first conductive features 242 can have a rectangular contour when viewed in a cross-sectional view. The second conductive features 246 include a base 243 disposed in the bonding dielectric 222 and a protrusion 244 stacked on the base 243 and above the bonding dielectric 222. The base 243 and the protrusion 244 have rectangular contours, and the second conductive features 246 can have L-shaped contours when viewed in the cross-sectional view. As shown in FIG. 1, the air gaps 250 have a first width W1, and the protrusions 244 of the second conductive feature 246 have a second width W2 less than the first width W1. The bases 243 of the second conductive feature 246 have a third width W3, and the first conductive features 242 have a fourth width W4 less than the third width W3. In some embodiments, the third width W3 can be equal to a sum of the first width W1 and the fourth width W4.

The semiconductor device 20 can further include a plurality of diffusion barrier liners 232 disposed between the first conductive features 242 and the bonding dielectric 222 and between the bases 243 and the bonding dielectric 222. The diffusion barrier liners 232 function as a glue layer for aiding adhesion of the first and second conductive features 242 and 246 to the bonding dielectric 222. In some embodiments, the diffusion barrier liners 232 are further disposed between the first conductive features 242 and the substrate 210 and between the bases 243 and the substrate 210 if the first and second conductive features 242 and 246 penetrate through the bonding dielectric 222. The diffusion barrier liners 232 have good diffusion barrier properties to inhibit the diffusion of metal from the first and second conductive features 242 and 246 into the substrate 210. The diffusion barrier liners 232, having a substantially uniform thickness, may be a single-layered structure or a multi-layered structure including refractory metals (such as titanium or tantalum), refractory metal nitrides and/or refractory metal silicon nitrides.

Figure 2:
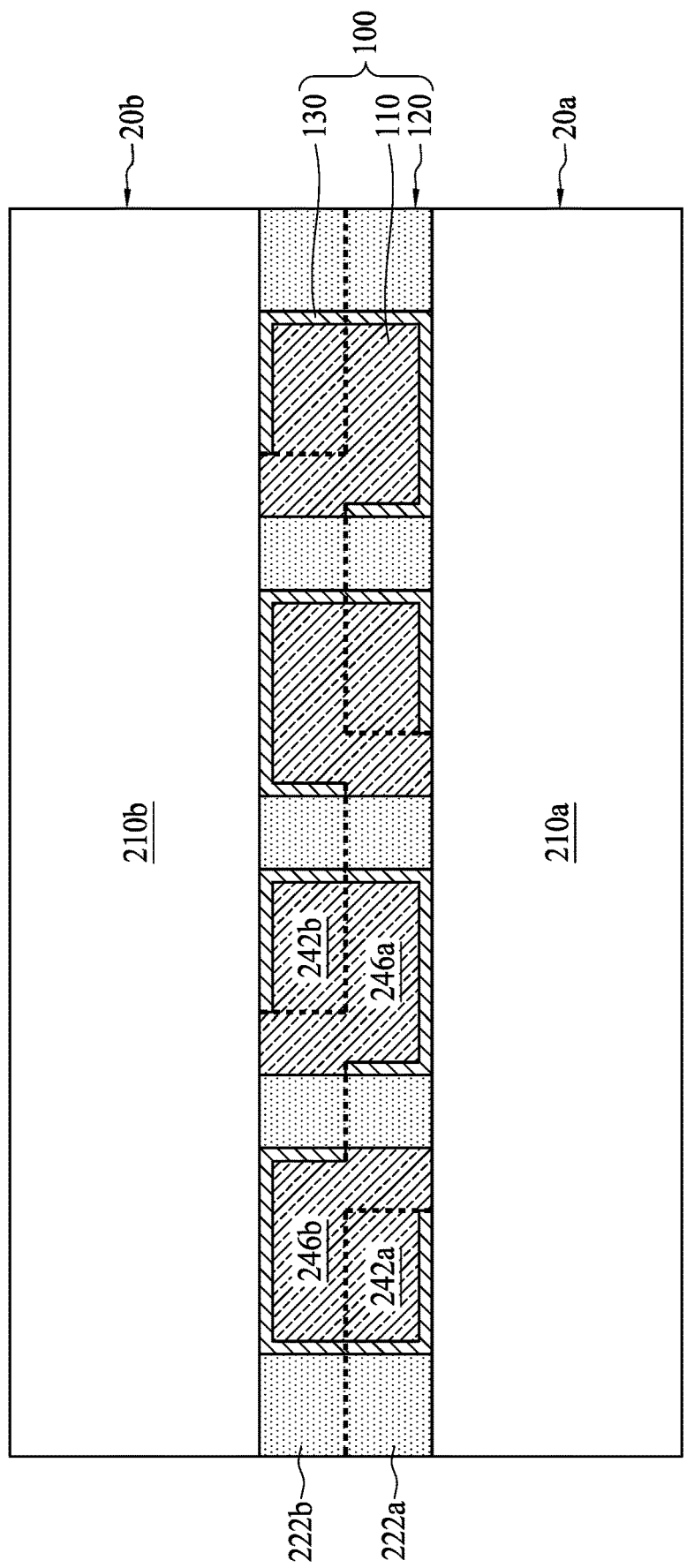
FIG. 2 is a cross-sectional view of a semiconductor device assembly in accordance with some embodiments of the present disclosure.

FIG. 2 is a cross-sectional view of a semiconductor device assembly 10 in accordance with some embodiments of the present disclosure. Referring to FIG. 2, the semiconductor device assembly 10 includes a pair of semiconductor devices, including a lower semiconductor device 20a and an upper semiconductor device 20b, aligned and bonded together using a hybrid bonding technique. The various layers of the lower and upper semiconductor devices 20a and 20b may be substantially similar to the layers of the semiconductor device 20 shown in FIG. 1, and repeated description of those layers is omitted for brevity.

The upper semiconductor device 20b is arranged upside down and stacked on the lower semiconductor device 20a, and a substrate 210b of the upper semiconductor device 20b is hybrid-bonded to a substrate 210a of the lower semiconductor device 20a for making physical and electrical connection between the substrates 210a and 210b. Various processes may be used to bond the substrates 210a and 210b; in some embodiments, the processes for bonding the substrates 210a and 210b include a metal-to-metal bonding process and a dielectric-to-dielectric bonding process. The substrate 210a and the substrate 210b can be fabricated using the same fabrication processes to form, for example, a memory stack. Alternatively, the substrate 210a and the substrate 210b may be fabricated using different fabrication processes to stack a memory device with a processor or application-specific integrated circuit (ASIC) device. In some embodiments, the substrate 210a and the substrate 210b are stacked in a front-to-front configuration.

In some embodiments, the lower and upper semiconductor devices 20a and 20b are aligned to cause first conductive features 242b of the upper semiconductor device 20b to be in contact with second conductive features 246a of the lower semiconductor device 20a, to cause second conductive features 246b of the upper semiconductor device 20b to be in contact with first conductive features 242a of the lower semiconductor device 20a, and to cause a bonding dielectric 222b of the upper semiconductor device 20b to contact a bonding dielectric 222a of the lower semiconductor device 20a. In some embodiments, the first and second conductive features 242a and 246a of the lower semiconductor device 20a are arranged in an interleaved arrangement, and the first and second conductive features 242b and 246b of the upper semiconductor device 20b are arranged in an interleaved configuration. After the alignment of the lower and upper semiconductor device 20a and 20b, heat and force are applied to bond the first conductive features 242a and 242b to the second conductive features 246b and 246a to form a plurality of conductive features 110, and to cure the bonding dielectrics 222a and 222b to form a dielectric layer 120. The conductive features 130 can serve as an electrical interconnection to the semiconductor substrate 210a and 210b.

A bonding structure 100 can optionally include diffusion barrier liners 130 disposed between portions of the conductive features 110 and the dielectric layer 120. In other words, a portion of the conductive feature 110 is in contact with the dielectric layer 120. The diffusion barrier liners 130, having a substantially uniform thickness, can be disposed between portions of the conductive features 110 and the substrates 210a and 210b if the conductive features 110 penetrate through the dielectric layer 120.

Figure 3:
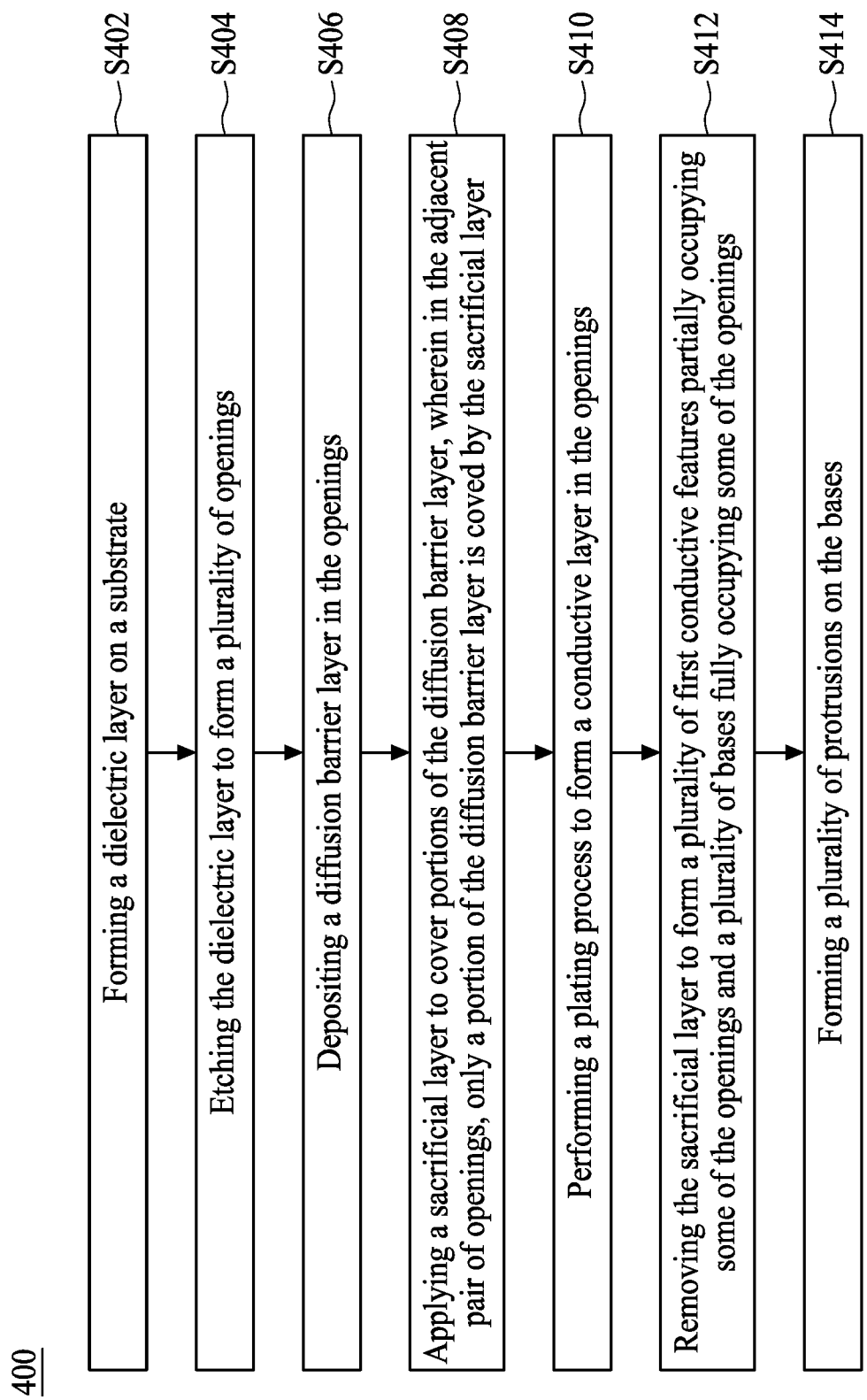
FIG. 3 is a flow diagram illustrating a method of manufacturing a semiconductor device in accordance with some embodiments of the present disclosure.

FIG. 3 is a flow diagram illustrating a method 400 of manufacturing a semiconductor device 20 in accordance with some embodiments of the present disclosure, and FIGS. 4 through 12 illustrate cross-sectional views of intermediate stages in the formation of the semiconductor device 20 in accordance with some embodiments of the present disclosure. The stages shown in FIGS. 4 to 12 are also illustrated schematically in the flow diagram in FIG. 3. In the following discussion, the fabrication stages shown in FIGS. 4 to 12 are discussed in reference to the process steps shown in FIG. 3.

Figure 4:
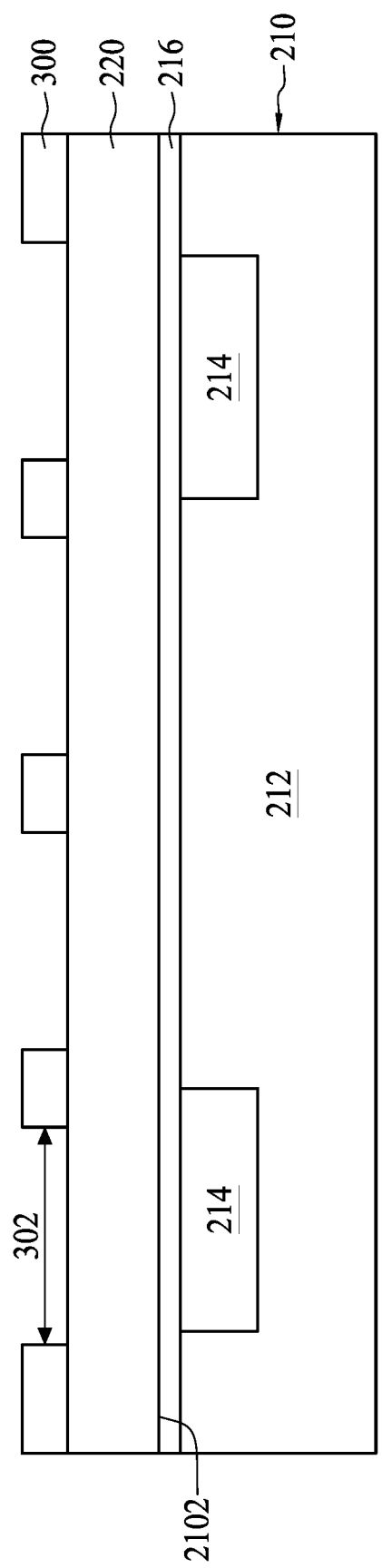
FIGS. 4 through 12 illustrate cross-sectional views of intermediate stages in the formation of a semiconductor device in accordance with some embodiments of the present disclosure.

Referring to FIG. 4, a dielectric layer 220 is formed on a substrate 210 according to a step S402 in FIG. 3. The substrate 210 includes a semiconductor wafer 212 and one or more main components 214 disposed in the semiconductor wafer 212. The semiconductor wafer 212 can be made of silicon. Alternatively or additionally, the semiconductor wafer 212 may include other elementary semiconductor materials such as germanium. In some embodiments, the semiconductor wafer 212 is made of a compound semiconductor such as silicon carbide, gallium arsenic, indium arsenide, or indium phosphide. In some embodiments, the semiconductor wafer 212 is made of an alloy semiconductor such as silicon germanium, silicon germanium carbide, gallium arsenic phosphide, or gallium indium phosphide. In some embodiments, the semiconductor wafer 212 can include an epitaxial layer. For example, the semiconductor wafer 212 has an epitaxial layer overlying a bulk semiconductor. The semiconductor wafer 212 may include various doped regions (not shown) doped with p-type dopants, such as boron, and/or n-type dopants, such as phosphorus or arsenic. In some embodiments, isolation features (not shown), such as shallow trench isolation (STI) features or local oxidation of silicon (LOCOS) features, can be introduced in the semiconductor wafer 212 to define and isolate various main components 214 in the semiconductor wafer 212.

The main components 214 may include active components, such as transistors and/or diodes, and passive components such as capacitors, resistors or the like. The main components 214 are formed using various processes including deposition, etching, implantation, photolithography, annealing, and/or other applicable processes. In addition, the main components 214 may interconnect with one another (through an interconnect layer 216) to form, for example, a logic device, a memory device, an input/output device, a system-on-chip device, another suitable type of device, or a combination thereof. In some embodiments, the main components 214 may be formed in the semiconductor wafer 212 during front-end-of-line (FEOL) processes. The interconnect layer 216, including alternatingly stacked metal lines and conductive plugs (not shown) embedded in insulative materials, is formed over the semiconductor wafer 210 in back-end-of-line (BEOL) processes in some embodiments, for example.

The dielectric layer 220 is formed over the entire upper surface 2102 of the substrate 210. The dielectric layer 220, including silicon-containing materials, such as silicon dioxide, may be formed using a spin-coating process, a plasma-enhanced chemical vapor deposition (CVD) process, or another suitable process that can form a dielectric material. In some embodiments, a planarizing process can be optionally performed on the dielectric layer 220 to yield an acceptably flat topology.

Next, an etching mask 300 is provided on the dielectric layer 220. The etching mask 300 includes one or more windows 302 to expose portions of the dielectric layer 220. The etching mask 300 is formed by performing an exposure process and a develop process on a photoresist material that fully covers the dielectric layer 220, wherein the photoresist material may be applied on the dielectric layer 220 by a spin-coating process and then dried using a soft-baking process.

Figure 5:
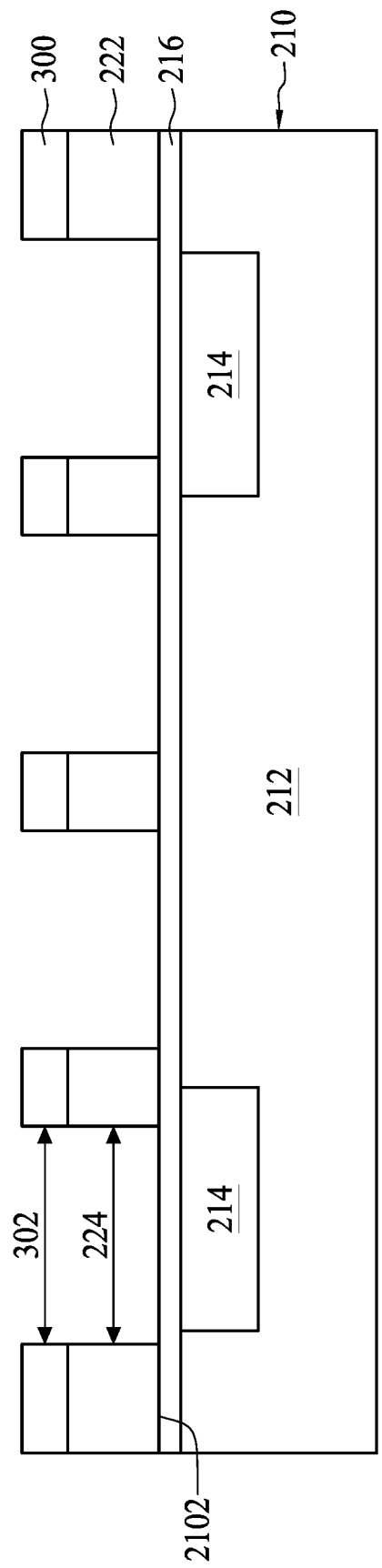

Referring to FIG. 5, the dielectric layer 220 is etched through the windows 302 to remove portions of the dielectric layer 220 according to a step S404 in FIG. 3. Consequently, a plurality of openings 224 are formed in the remaining dielectric layer (hereinafter referred to as the "bonding dielectric") 222. In some embodiments, portions of the substrate 210 are exposed through the openings 224. The dielectric layer 220 is etched using a dry etching process, an anisotropic wet etching process, or any other suitable anisotropic process. After the formation of the openings 224, the etching mask 300 is removed using an ashing process or a strip process, for example.

Figure 6:
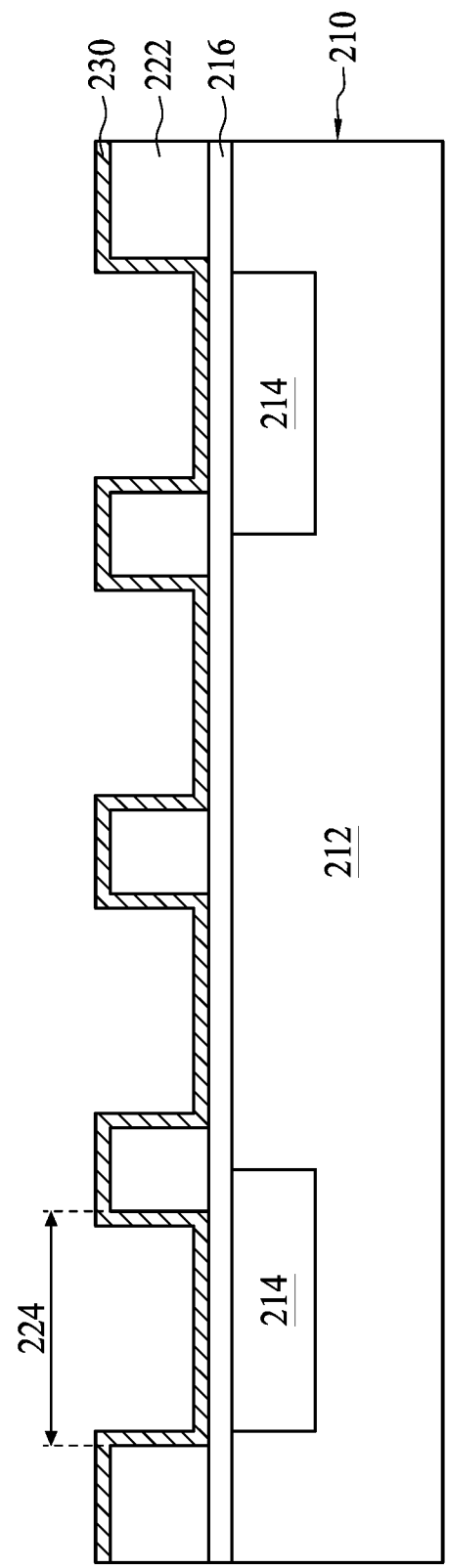

Referring to FIG. 6, a diffusion barrier layer 230 is deposited in the openings 224 according to a step S406 in FIG. 3. The diffusion barrier layer 230 is deposited on the bonding dielectric 222, but does not fill up the openings 224. In some embodiments, the diffusion barrier layer 230, having a substantially uniform thickness, covers the exposed portions of the substrate 210 if the openings 224 penetrate through the bonding dielectric 222. In other words, the diffusion barrier layer 230 has a topology following the topology of the bonding dielectric 222 and the exposed portions of the substrate 210. The diffusion barrier layer 230 can be formed using a PVD process, a CVD process, a sputtering process or an atomic layer deposition (ALD) process, wherein the diffusion barrier layer 230 deposited using the ALD process is highly uniform in thickness.

Figure 7:
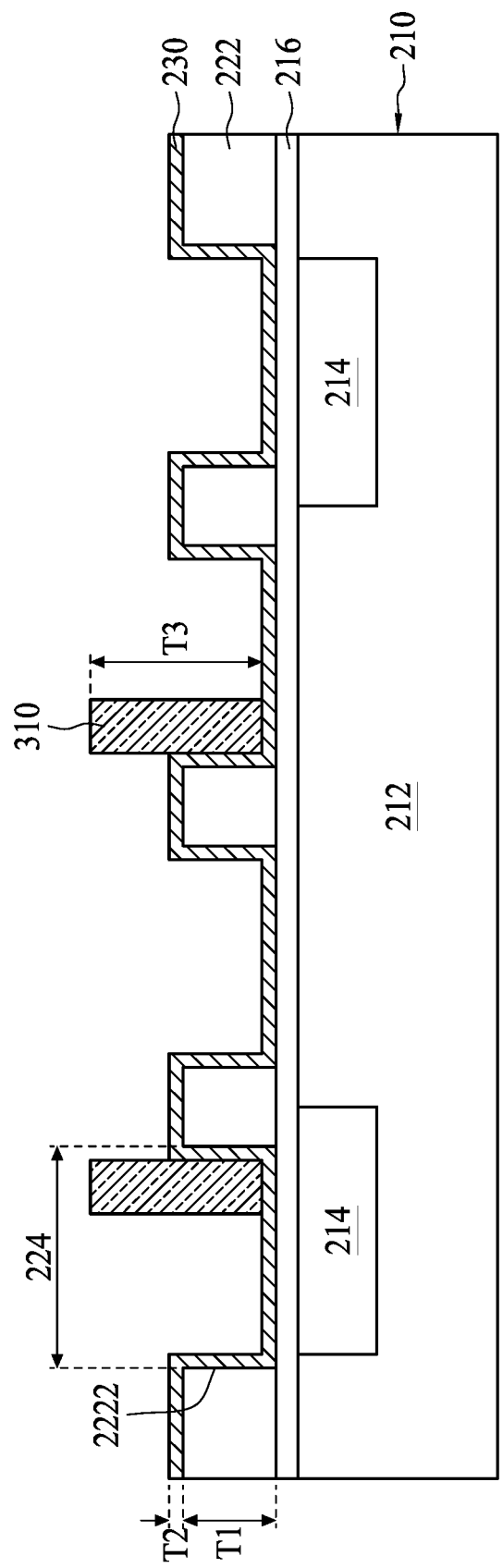

Referring to FIG. 7, a sacrificial layer 310 is applied in at least one of the openings 224 to cover at least a portion of the diffusion barrier layer 230 according to a step S408 in FIG. 3. In some embodiments, in the adjacent pair of openings 224, only a portion of the diffusion barrier layer 230 is protected by the sacrificial layer 310. In addition, the sacrificial layer 310 contacts a portion of the diffusion barrier layer 230 coated on sidewalls 2222 of the bonding dielectric 222. As shown in FIG. 7, the bonding dielectric 222 includes a first thickness T1, the diffusion barrier layer 230 has a second thickness T2, and the sacrificial layer 310 has a third thickness T3 greater than a sum of first thickness T1 and the second thickness T2. The sacrificial layer 310 includes a material which can be reacted away without removing other structures. In some embodiments, the sacrificial layer 310 includes, for example, a photoresist material and is formed by performing an exposure process and a develop process on the photoresist material fully covering the diffusion barrier layer 230 and deposited in the openings 224. The portion of space occupied by the sacrificial layer 310 is the space to be formed into an air gap, as will be described later.

Figure 8:
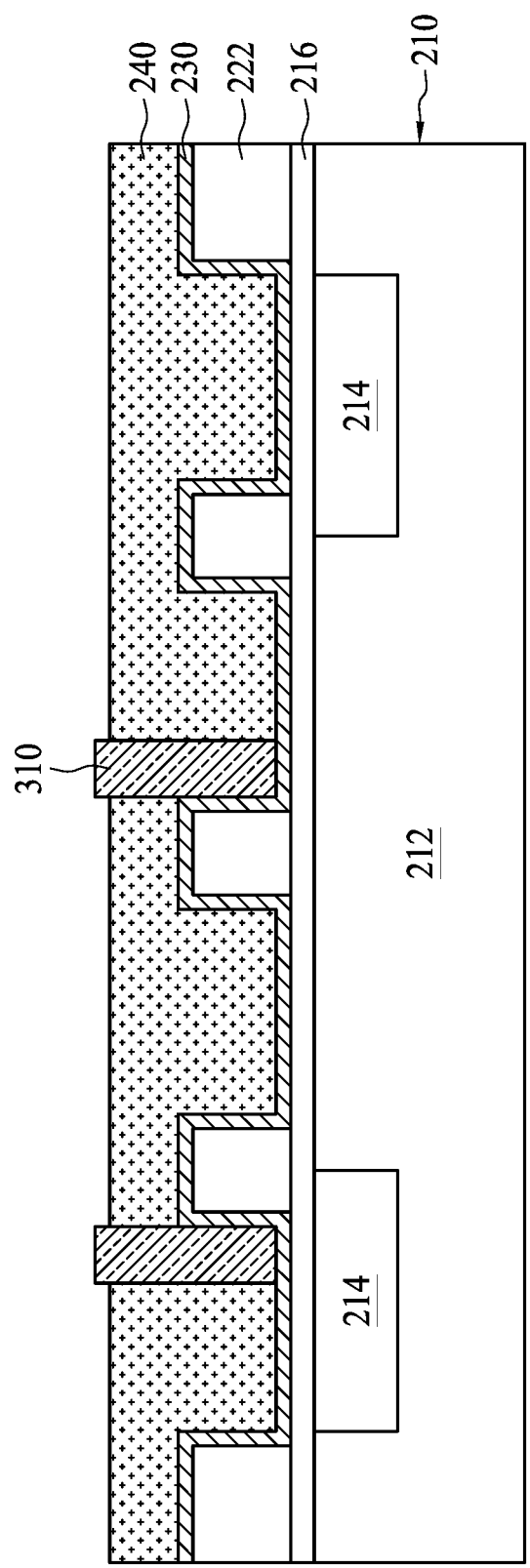

Referring to FIG. 8, a plating process is performed to form a conductive layer 240 in the openings 224 according to a step S410 in FIG. 3. In some embodiments, the conductive layer 240 covers a portion of the diffusion barrier layer 230 not protected by the sacrificial layer 310. In some embodiments, the conductive layer 240 is in contact with portions of a periphery of the sacrificial layer 310, but does not envelop the sacrificial layer 310 to facilitate the removal of the sacrificial layer 310, as will be described later. If the sacrificial layer 310 is buried in the conductive layer 240, an additional polishing process needs to be performed on the conductive layer 240 to expose the sacrificial layer 310. The conductive layer 240 includes metal, such as copper, aluminum, tungsten, cobalt, titanium, gold, platinum or a combination thereof.

Figure 9:
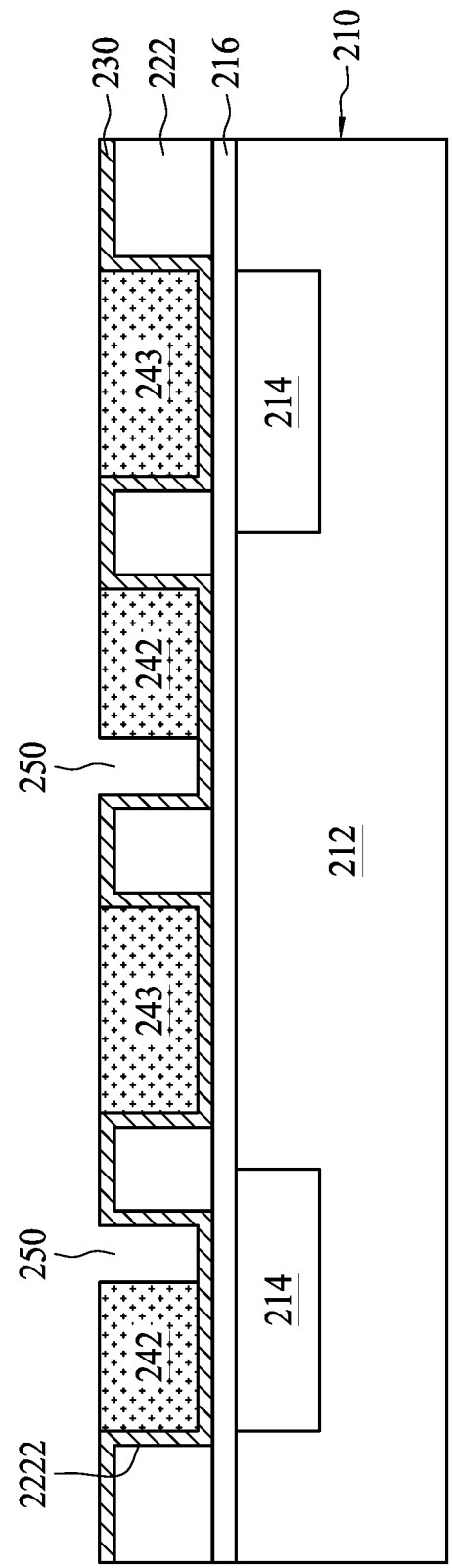

Referring to FIG. 9, a removal process is performed to remove the sacrificial layer 310 according to a step S412 in FIG. 3. After the performing of the removal process, spaces previously occupied by the sacrificial layer 310 are now air gaps 250. In other words, after the performing the removal process, at least a portion of the diffusion barrier layer 230 is exposed through the conductive layer 240. The sacrificial layer 310 can be removed using an ashing process or a wet strip process, for example. A planarizing process can be performed to remove the conductive layer 240 above the bonding dielectric 222, thereby forming at least one first conductive feature 242 partially occupying some of the openings 224 and a plurality of bases 243 fully occupying some of the openings 224. In some embodiments, the first conductive features 242 and the bases 243 can be arranged in an interleaved configuration.

Figure 10:
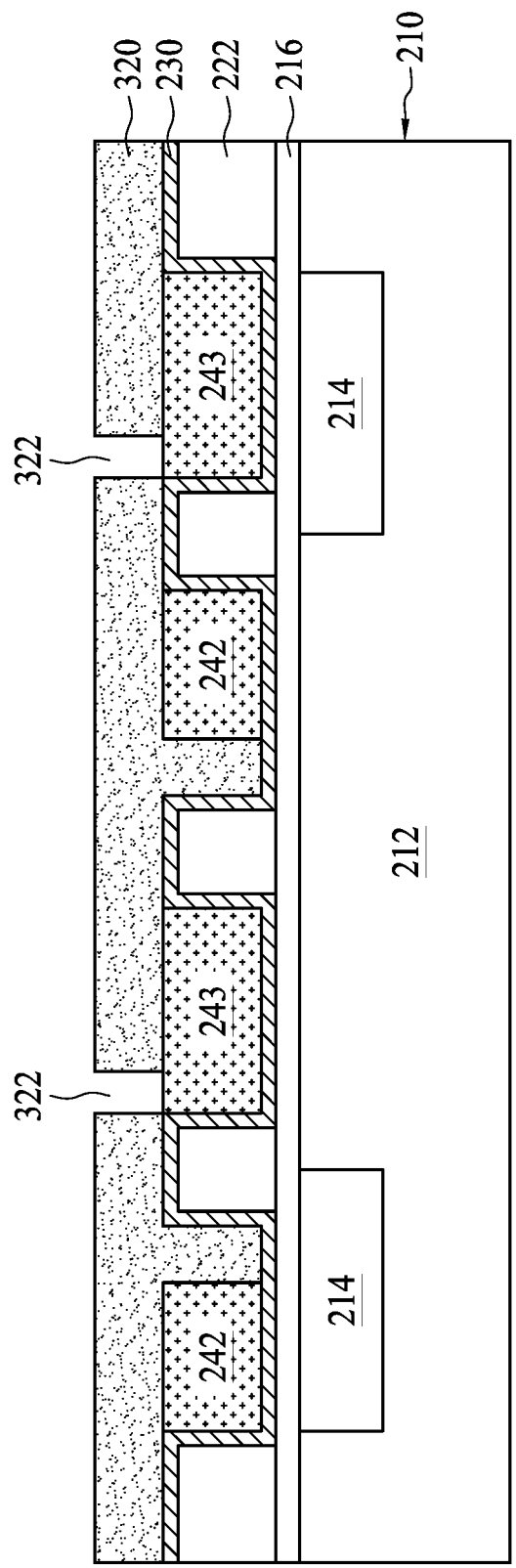

Referring to FIG. 10, a patterned mask 320 is applied on the diffusion barrier layer 230, the first conductive features 242 and the bases 243. The patterned mask 320 includes a plurality of through holes 322 to expose portions of the bases 243. The patterned mask 320 is formed by performing an exposure process and a develop process on a photoresist material fully covering the diffusion barrier layer 230, the first conductive features 242 and the bases 243.

Figure 11:
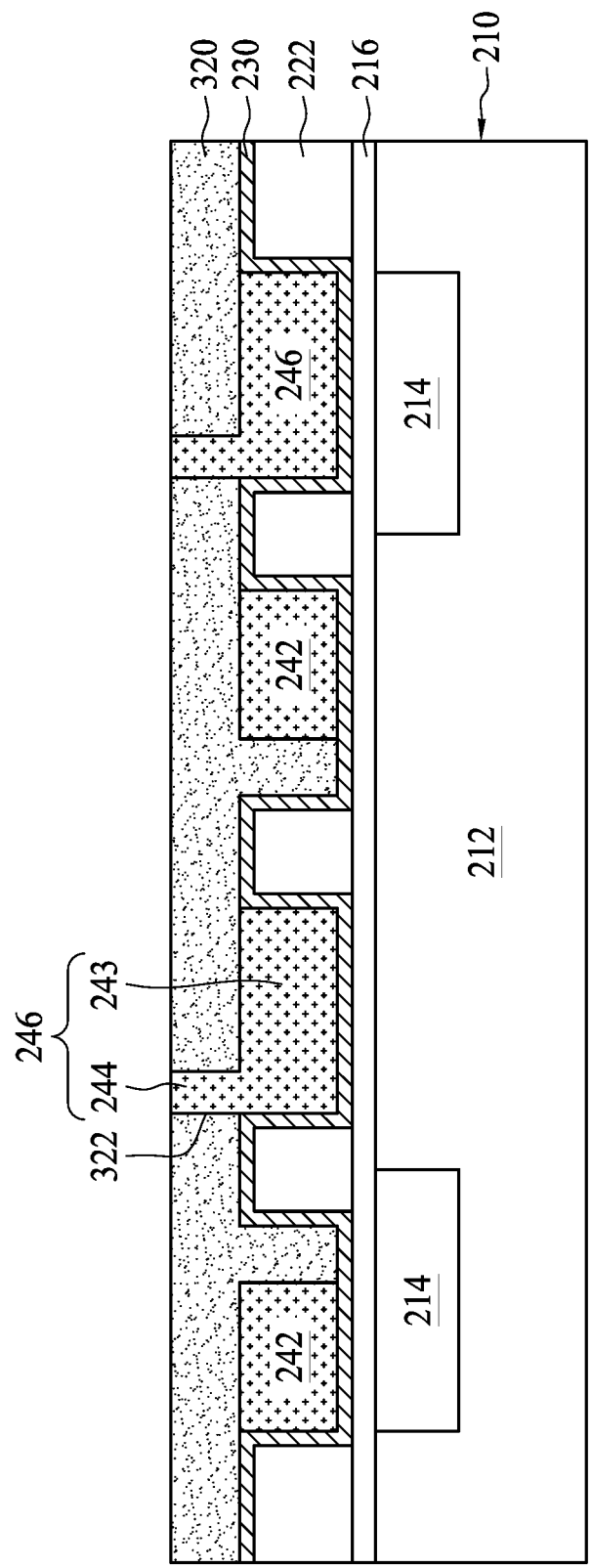

Referring to FIG. 11, a plurality of protrusions 244 are formed on the bases 243 according to a step S414 in FIG. 3. Accordingly, a plurality of second conductive features 246 including the bases 243 and the protrusions 244 stacked on the bases 243 are formed. The protrusions 244 are formed by depositing a conductive material in the through holes 322 in the patterned mask 320. In some embodiments, the filling of the through holes 322 may include a plating process. In some embodiments, after the plating process, the conductive material may overflow the through holes 322 and cover the patterned mask 320; accordingly, an additional planarization may be performed to remove the overflow portion of the conductive material. In some embodiments, the base 243 and the protrusion 244 can have the same material. After the formation of the protrusions 244, the patterned mask 320 is removed using an ashing process or a strip process, for example.

Figure 12:
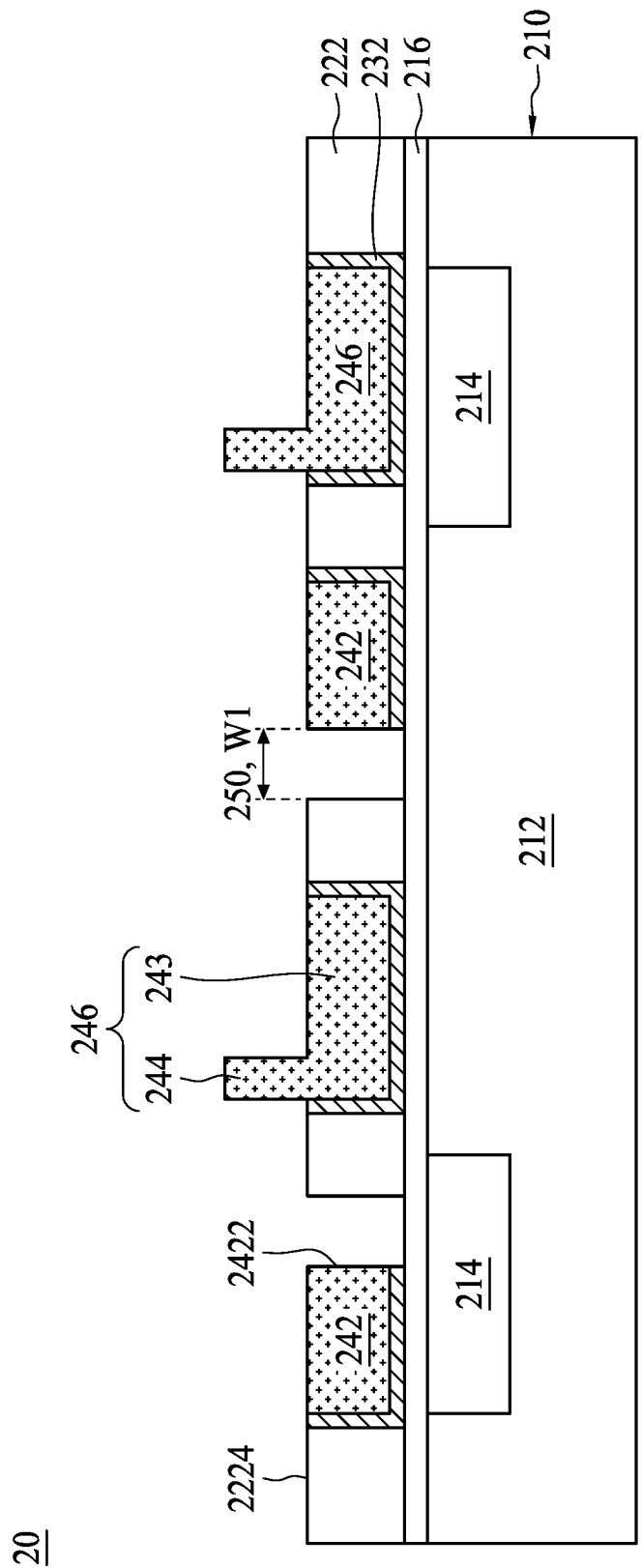

Referring to FIG. 12, an etching process is carried out to remove portions of the diffusion barrier layer 230 not protected by the first and the second conductive features 242 and 246. Consequently, the diffusion barrier liners 232 are formed between the first conductive feature 242 and the bases 243 of the second conductive features 246, an upper surface 2224 of the bonding dielectric 222 is exposed, and the semiconductor device 20 is completely formed.

Figure 13:
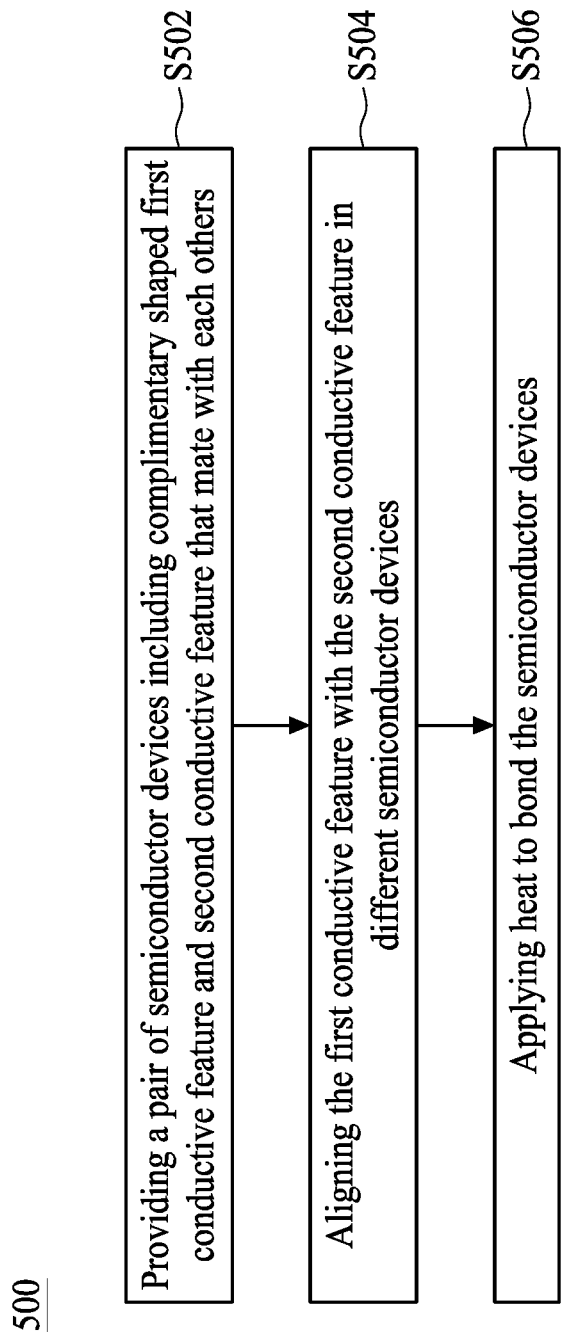
FIG. 13 is a flow diagram illustrating a method of manufacturing a semiconductor device assembly in accordance with some embodiments of the present disclosure.
Figure 14:
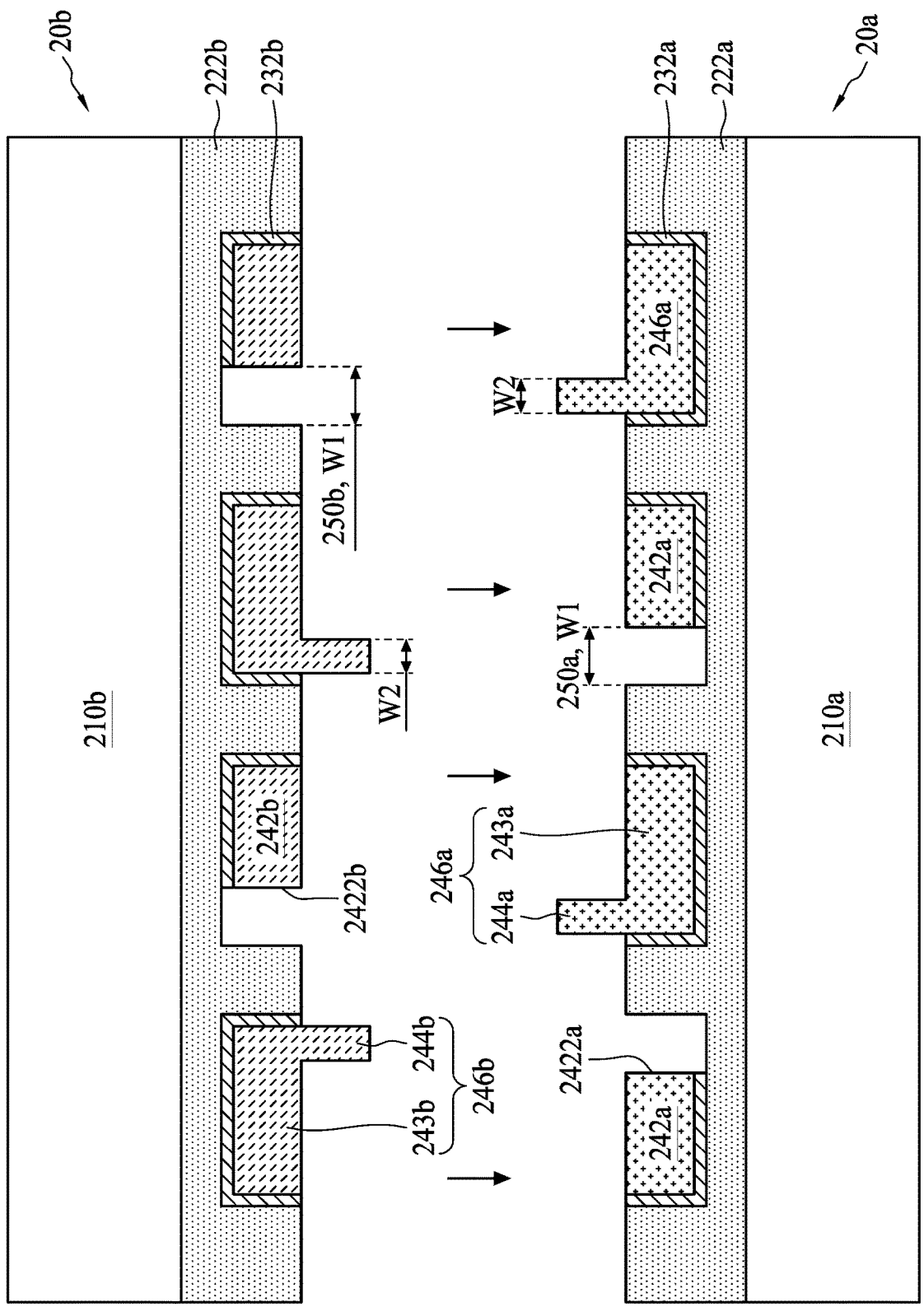
FIGS. 14 and 15 illustrate cross-sectional views of intermediate stages in the formation of a semiconductor device assembly in accordance with some embodiments of the present disclosure.
Figure 15:
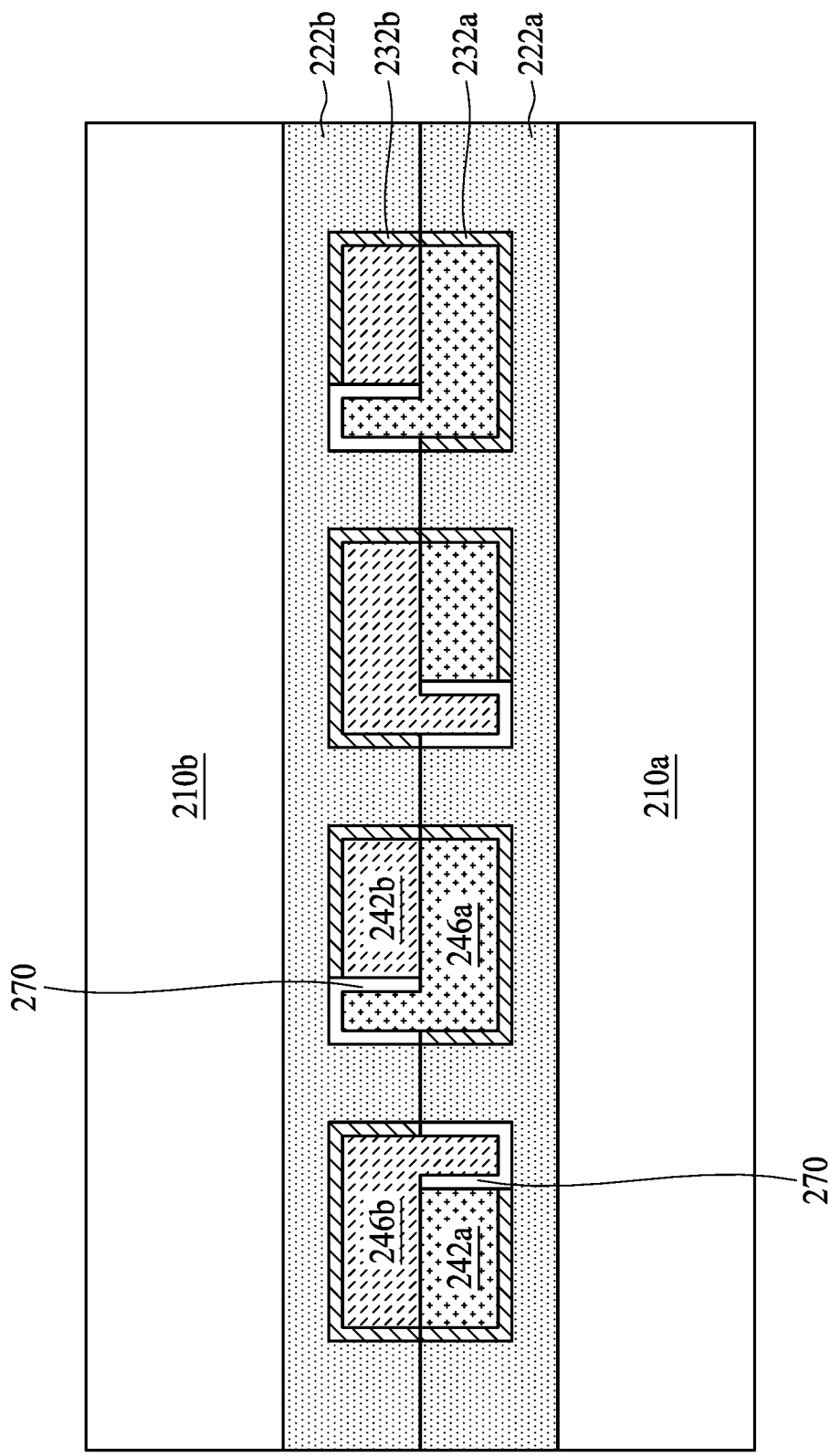

FIG. 13 is a flow diagram illustrating a method 500 of manufacturing a semiconductor device assembly 10 in accordance with some embodiments of the present disclosure, and FIGS. 14 and 15 illustrate cross-sectional views of intermediate stages in the formation of the semiconductor device assembly 10 in accordance with some embodiments of the present disclosure. The stages shown in FIGS. 14 and 15 are also illustrated schematically in the flow diagram in FIG. 13. In the following discussion, the fabrication stages shown in FIGS. 14 and 15 are discussed in reference to the process steps shown in FIG. 13.

Referring to FIG. 14, a lower semiconductor device 20a and an upper semiconductor device 20b including complimentary shaped first conductive features 242a/242b and second conductive features 246a/246b are provided according to a step S502 in FIG. 13. In FIG. 14, the lower semiconductor device 20a includes a plurality of first conductive features 242a and a plurality of the second conductive features 246a arranged in an interleaved configuration, and the upper semiconductor device 20b includes a plurality of first conductive features 242b and a plurality of second conductive features 246b arranged in an interleaved configuration. Alternatively, in some embodiments, the lower and upper semiconductor devices 20a and 20b can include a first conductive feature and a second conductive feature, wherein the first conductive feature is disposed over one of the lower and upper semiconductor devices and the second conductive feature is disposed over the other semiconductor device.

The lower and upper semiconductor devices 20a/20b further include bonding dielectrics 222a/222b disposed on substrates 210a/210b and covering a major portion of peripheries 2422a/2422b of the first conductive features 242a/242b and enclosing bases 243a/243b of the second conductive features 246a/246b. At least one air gap 250a/250b is introduced in each of the dielectric layers 222a/222b to expose the other portion of the peripheries 2422a/2422b of the first conductive features 242a/242b. The air gaps 250a and 250b have a first width W1, and the protrusions 244a and 244b can have a second width W2 less than the first width W1. The lower/upper semiconductor devices 20a/20b can also include a plurality of diffusion barrier liners 232a/232b interposed between the bonding dielectric 222a/222b and the first conductive feature 242a/242b and between the base 243a/243b and the bonding dielectric 222a/222b.

Next, the first conductive features 242b and the second conductive features 246b of the upper semiconductor device 20b are aligned with the second conductive features 246a and the first conductive features 242a of the lower semiconductor device 20a, respectively, according to a step S504. As shown in FIG. 14, the second conductive features 246a/246b include a base 243a/243b disposed in the bonding dielectric 222a/222b and a protrusion 244a/244b stacked on the base 243a/243b. The first conductive features 242a/242b and the second conductive features 246a/246b are aligned to allow the protrusions 244a of the lower semiconductor device 20a to be received into the air gaps 250b in the upper semiconductor device 20b, and to allow the protrusions 244b of the upper semiconductor device 20b to be received into the air gaps 250a after the upper semiconductor device 20b is stacked on the lower semiconductor device 20a, as shown in FIG. 15. Referring to FIGS. 14 and 15, after the lower and upper semiconductor devices 20a and 20b are stacked, the bases 243b of the upper semiconductor device 20b are in contact with the first conductive features 242a of the lower semiconductor device 20a, and the first conductive features 242b of the upper semiconductor device 20b are in contact with the bases 243a of the lower semiconductor device 20a. Due to the second width W2 of the protrusions 244a and 244b being less than the first width W1 of the air gaps 250a and 250b, voids 270 are formed in the stacked lower and upper semiconductor devices 20a and 20b. The voids 270 may be intentional to allow expansion of the first conductive features 242a and 242b and the second conductive features 246a and 246b.

Next, an annealing process is performed to bond the first conductive features 242a and 242b to the second conductive features 246b and 246a, thus forming a plurality of conductive features 110 shown in FIG. 2. The annealing process further fuses the bonding dielectrics 222a and 222b, thus forming a dielectric layer 120 shown in FIG. 2. In some embodiments, during the annealing process, the stacked lower and upper semiconductor devices 20a and 20b are heated to a first predetermined temperature, such that the bonding dielectrics 222a and 222b become a non-confined viscous liquid and are reflowed. Thereafter, the stacked lower and upper semiconductor devices 20a and 20b are further heated to a second predetermined temperature higher than the first predetermined temperature, such that the first conductive features 242a and 242b and the second conductive features 246a and 246b are interconnected by thermocompression bonding and the bonding dielectrics 222a and 222b are fully cured. In some embodiments, as a result of the annealing process, the material of the first conductive features 242a and 242b and the second conductive features 246a and 246b are stretched and the voids 270 can be eliminated. Therefore, the semiconductor device 10 shown in FIG. 2 is completely formed.

In conclusion, the reliability and performance of the semiconductor device assembly 10 formed by a bonded pair of the semiconductor device 20, including complimentary-shaped first conductive feature(s) 242 and second conductive feature(s) 246 that mate with one another, together can be improved since the bonding interface is increased.

One aspect of the present disclosure provides a semiconductor device. The semiconductor device comprises a substrate, a bonding dielectric, at least one first conductive feature, at least one second conductive feature, and at least one air gap. The bonding dielectric is disposed on the substrate. The first conductive feature is disposed in the bonding dielectric. The second conductive feature comprises a base disposed in the bonding dielectric and a protrusion stacked on the base. The air gap is disposed in the bonding dielectric to separate a portion of a periphery of the first conductive feature from the bonding dielectric.

One aspect of the present disclosure provides a semiconductor device. The method includes steps of forming a dielectric layer on a substrate; etching the dielectric layer to create a plurality of openings in the dielectric layer; applying a sacrificial layer in at least one of the openings to cover at least a portion of the dielectric layer; forming at least one first conductive feature in the openings where the sacrificial layer is disposed and a plurality of bases in the openings where the sacrificial layer is not disposed; removing the sacrificial layer to form at least one air gap in the dielectric layer; and forming a plurality of protrusions on the bases.

One aspect of the present disclosure provides a method of manufacturing a semiconductor device assembly. The method includes steps of providing a pair of semiconductor devices comprising at least one first conductive feature and at least one second conductive feature having complimentary structures; aligning the semiconductor devices to cause the first conductive feature of one of the semiconductor devices to be in contact with the second conductive feature of the other semiconductor device; and performing an annealing process to bond the first conductive feature to the second conductive feature.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate;
   a bonding dielectric disposed on the substrate;
   at least one first conductive feature disposed in the bonding dielectric;
   at least one air gap disposed in the bonding dielectric to separate a portion of a periphery of the first conductive feature from the bonding dielectric; and
   at least one second conductive feature comprising a base disposed in the bonding dielectric and a protrusion stacked on the base;
   wherein the air gap has a first width, and the protrusion of the second conductive feature has a second width less than the first width.

2. The semiconductor device of claim 1, wherein the second conductive feature has an L-shaped contour.

3. The semiconductor device of claim 1, further comprising a plurality of diffusion barrier liners disposed between the bonding dielectric and the first conductive feature and between the bonding dielectric and the base.

4. The semiconductor device of claim 1, wherein the first conductive feature and the second conductive feature penetrate through the bonding dielectric and contact the substrate.

5. The semiconductor device of claim 1, wherein the base of the second conductive feature has a third width, and the first conductive feature has a fourth width less than the third width.

6. The semiconductor device of claim 5, wherein the third width is equal to a sum of the first width and the fourth width.

* * * * *